(12) United States Patent
Feldman et al.

(10) Patent No.: US 6,522,618 B1
(45) Date of Patent: Feb. 18, 2003

(54) INTEGRATED OPTICAL APPARATUS AND ASSOCIATED METHODS

(75) Inventors: Michael R. Feldman, Charlotte, NC (US); Alan D. Kathman, Charlotte, NC (US); W. Hudson Welch, Charlotte, NC (US)

(73) Assignee: Digital Optics Corp., Charlotte, NC (US)

( * ) Notice: Subject to any disclaimer, the term of this patent is extended or adjusted under 35 U.S.C. 154(b) by 0 days.

(21) Appl. No.: 09/637,364

(22) Filed: Aug. 15, 2000

Related U.S. Application Data

(63) Continuation of application No. 09/274,310, filed on Mar. 23, 1999, now Pat. No. 6,104,690, which is a continuation of application No. 09/018,891, filed on Feb. 5, 1998, now Pat. No. 5,912,872, which is a continuation-in-part of application No. 08/727,837, filed on Sep. 27, 1996, and a continuation-in-part of application No. 08/994,281, filed on Dec. 19, 1997, now Pat. No. 5,886,971.

(51) Int. Cl.$^7$ ................................................ G11B 7/00
(52) U.S. Cl. ................................ 369/112.01; 369/44.12; 369/13.32
(58) Field of Search ........................ 369/112.04, 112.15, 369/112.19, 112.24, 112.12, 103, 116, 44.23, 284, 44.14, 44.37, 118.03, 112.17, 13.32, 275.1, 112.01; 385/31

(56) References Cited

U.S. PATENT DOCUMENTS

| | | | |
|---|---|---|---|
| 4,626,103 A | 12/1986 | Feldman et al. | 356/508 |
| 4,636,080 A | 1/1987 | Feldman | 356/401 |
| 4,672,187 A | * 6/1987 | Fujita et al. | 369/112.05 |
| 4,866,694 A | 9/1989 | Korth | 369/44.12 |

(List continued on next page.)

FOREIGN PATENT DOCUMENTS

| | | |
|---|---|---|
| EP | 0 510 750 A1 | 10/1992 |
| EP | 0 581 519 A2 | 2/1994 |
| FR | 2725547 | 3/1996 |
| JP | 9251663 | 9/1997 |
| WO | WO/9311453 | 6/1993 |

OTHER PUBLICATIONS

Sasaki et al: "Marker Alignment Method for Passive Laser Coupling on silicon Waferboard" Ieice Transactions on Communications, vol. E79–B, No. 7, Jul. 1996, pp. 939–942, XP000628628.

*Primary Examiner*—Paul W. Huber
*Assistant Examiner*—Kim-Kwok Chu
(74) *Attorney, Agent, or Firm*—Susan S. Morse

(57) ABSTRACT

An integrated optical apparatus includes an optically transparent substrate with a light source and a detector mounted adjacent thereto. The substrate includes an optical element in a transmit path from the light source to a remote target. The optical element splits the light into more than one beam. A detector receives beams reflected by the target. All optical elements needed to create the more then one beam, direct the more than one beam onto the target and direct the more than one beam from the target to the detector are on the substrate and/or any structure bonded to the substrate. Preferably, the optical element provides sufficient separation between the more than one beam such that each beam is delivered to a unique respective light detecting element of the detector. The return path from the remote target to the detector may include an optical element for each beam or no optical elements. An additional substrate may be included and bonded to the substrate. The active elements may be bonded to a bottom surface of the substrate, either directly or via spacer blocks, or may be provided on a support substrate, which is then bonded, either directly or via spacer blocks, to the substrate.

26 Claims, 8 Drawing Sheets

U.S. PATENT DOCUMENTS

| | | | | |
|---|---|---|---|---|
| 4,966,446 A | * 10/1990 | Huang et al. | ............... | 359/107 |
| 5,025,165 A | 6/1991 | Chen et al. | ............... | 250/491.1 |
| 5,093,879 A | * 3/1992 | Bregman et al. | ...... | 250/227.11 |
| 5,159,473 A | 10/1992 | Feldman | ....................... | 359/1 |
| 5,168,324 A | 12/1992 | Hackel et al. | ............... | 356/454 |
| 5,170,269 A | 12/1992 | Lin et al. | .................... | 359/170 |
| 5,189,485 A | 2/1993 | Hackel et al. | ............... | 356/320 |
| 5,202,775 A | 4/1993 | Feldman et al. | ............... | 359/11 |
| 5,204,516 A | 4/1993 | Opheij | ..................... | 250/201.5 |
| 5,229,883 A | 7/1993 | Jackson et al. | ............. | 359/569 |
| 5,237,434 A | 8/1993 | Feldman et al. | ............... | 359/19 |
| 5,309,282 A | 5/1994 | Feldman et al. | ............ | 359/641 |
| 5,317,551 A | * 5/1994 | Shiono | ....................... | 359/571 |
| 5,337,398 A | 8/1994 | Benzoni et al. | ................ | 385/90 |
| 5,418,870 A | * 5/1995 | Keck et al. | ................ | 385/126 |
| 5,446,814 A | 8/1995 | Kuo et al. | .................... | 385/31 |
| 5,457,314 A | * 10/1995 | Kim et al. | .................. | 250/239 |
| 5,499,312 A | 3/1996 | Hahn et al. | .................... | 385/91 |
| 5,499,732 A | 3/1996 | Mishimoto | ................... | 438/25 |
| 5,565,574 A | * 10/1996 | Hoeger et al. | .............. | 530/313 |
| 5,583,843 A | 12/1996 | Horinouchi | .............. | 369/112.1 |
| 5,608,233 A | 3/1997 | Sahara et al. | .................. | 257/80 |
| 5,621,715 A | 4/1997 | Ohyama | ................ | 369/112.12 |
| 5,629,919 A | * 5/1997 | Hayashi et al. | ........ | 369/112.17 |
| 5,638,469 A | 6/1997 | Feldman et al. | .............. | 385/14 |
| 5,648,950 A | * 7/1997 | Takeda et al. | ......... | 369/110.03 |
| 5,652,744 A | 7/1997 | Freeman et al. | ....... | 369/112.07 |
| 5,687,155 A | 11/1997 | Fukakusa et al. | ...... | 369/112.06 |
| 5,712,841 A | * 1/1998 | Opheij et al. | ............... | 369/103 |
| 5,805,556 A | 9/1998 | Lee et al. | ................ | 369/112.07 |
| 5,856,048 A | * 1/1999 | Tahara et al. | .................. | 430/1 |
| 5,910,940 A | * 6/1999 | Guerra | ..................... | 369/275.1 |
| 6,005,835 A | * 12/1999 | Tsuji et al. | ............ | 369/112.15 |

* cited by examiner

INTEGRATED OPTICAL APPARATUS AND ASSOCIATED METHODS

CROSS REFERENCE TO RELATED APPLICATIONS

This application is a continuation of U.S. application Ser. No. 09/274,310 filed Mar. 23, 1999 now U.S. Pat. No. 6,104,690 which is a continuation of U.S. application Ser. No. 09/018,891, now U.S. Pat. No. 5,912,8720, filed on Feb. 5, 1998 which is a continuation-in-part application of U.S. application Ser. No. 08/727,837 filed on Sep. 27, 1996 entitled "Integrated Optical Head and Associated Methods", and a continuation-in-part of U.S. application Ser. No. 08/994,281, now U.S. Pat. No. 5,886,971, filed on Dec. 19, 1997, the entire contents of all of which are hereby incorporated by reference for all purposes.

FILED OF THE INVENTION

The present invention relates to the field of optics and, more particularly, to an integrated optical apparatus providing more than one signal in separate return paths.

BACKGROUND OF THE INVENTION

Many typical computer systems include a disk drive cooperating with storage media to permit storage and retrieval of data. A typical optical disk drive includes an optical head that conventionally uses a laser to transmit light to the optical disk. Light reflected from the surface of the disk is detected by an optical detector and processed to read data from the disk. An example of such an optical head is disclosed, for example, in U.S. Pat. No. 5,204,516 titled "Planar Optical Scanning Head Having Deficiency Correcting Grating" by Opheij.

The size of the various optical head components, however, are often too large for many desired applications and many market demands. Also, as densities of integrated circuits and system boards increase, the demand for smaller components increases. Additionally, the production process for a conventional optical head requires that the laser be excited or turned-on (i.e., "active alignment") for 25 alignment of the laser, the detector, and the optical elements. An example of active alignment processes is illustrated and described in an article 10 published in Optical Engineering (June 1989) titled "Holographic Optical Head For Compact Disk Applications" by Lee.

Unfortunately, these active alignment requirements are complex, time consuming, and relatively expensive. Further, the level of size reduction in the vertical direction of an optical head is limited. In addition, the relatively large size of the elements of an optical head which can be manipulated is determined by the need for active alignment.

SUMMARY OF THE INVENTION

With the foregoing background in mind, it is therefore an object of the present invention to provide an optical head, such as for a disk drive, and related methods which is more compact and less expensive to manufacture. It is further an object of the present invention to provide more than one signal having unique return paths.

These and other objects, advantages, and features of the present invention are provided by an integrated optical head having more than one or no optical elements in a return path from a target, thereby forming unique return paths for each beam. The integrated optical head preferably includes an optically transparent substrate having first and second faces. The substrate may include a diffractive optical element formed on a face thereof. A light source, such as a laser, is positioned adjacent the first face of the substrate to transmit light through the substrate, through the diffractive optical element, and toward a target, such as optical storage media. An optical element provided in the substrate splits the light from the light source into more than one beam. An optical detector is positioned adjacent the first surface of the substrate to detect respective beams reflected from the target and through the substrate. All of the optical elements needed to create the more than one beam, direct the more than one beam onto the target, and direct the more than one beam form the target onto said detector are on the substrate and/or any structure bonded to the substrate. Preferably, the detector includes more than one detecting element for detecting respective beams of the more than one beam.

In another embodiment, a second transparent substrate is aligned and joined to the first substrate. The second substrate may carry one or more optical elements. According to this aspect of the invention, alignment areas in the form of benches or other mechanical features may be formed in one surface and mating recesses, for example, may be formed in the other surface. Adhesive attachment areas, which may overlap the alignment areas, hold the substrates together. Alignment may also be accomplished at the wafer level by having the elements of each die accurately placed using photolithography to accurately align the two wafers. The assembled dies can then be diced without the individual alignment means or steps being required for connecting the first and second substrates.

These and other objects of the present invention will become more readily apparent from the detailed description given hereinafter. However, it should be understood that the detailed description and specific examples are given by way of illustration only and are directed to the preferred embodiments of the present invention, since various changes and modifications within the spirit and scope of the invention will become apparent to those skilled in the art from this detailed description.

BRIEF DESCRIPTION OF THE DRAWINGS

Some of the objects and advantages of the present invention having been stated, others will become apparent as the description proceeds when taken in conjunction with the accompanying drawings in which.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the illustrated embodiments set forth herein. Rather, these illustrated embodiments are provided so that this disclosure will be thorough and complete, and will fully convey the scope of the invention to those skilled in the art. Like numbers refer to like elements throughout.

Figure 1A:
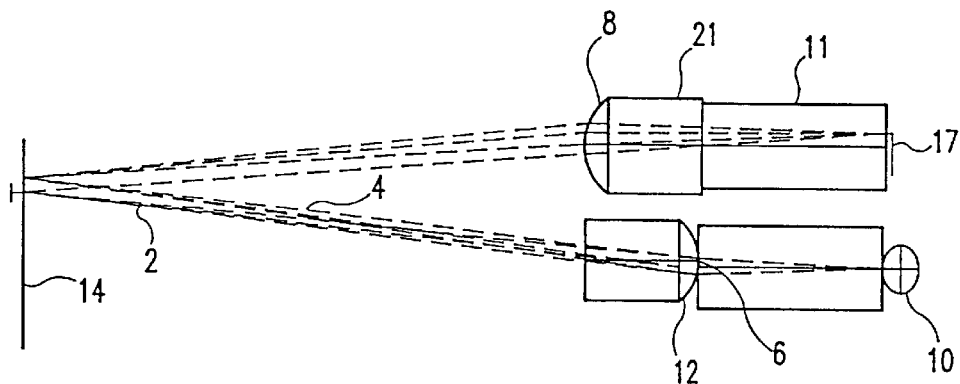
FIG 1A is a schematic view of a configuration of an integrated optical apparatus in accordance with the present invention.

FIG. 1A is an optical design schematic of an integrated assembly including a light source 10, a transmit diffractive optical element (DOE) 6, a transmit refractive lens 12, a return refractive lens 8 and a detector 17. These elements are integrated onto transparent substrates. Light output by the light source 10 is split into a plurality of light beams by the DOE 6. These beams are delivered to a target surface 14 via the transmit refractive lens 12. In FIG. 1A, two beams 2, 4 are shown as an example, although any number may be used. These beams are reflected by the target surface to the detector 17 via the return refractive lens 8. The detector may include more than one detector, one for each beam, or a single detector with unique areas designated for each beam.

When the light source is a laser, it is preferably the semiconductor laser chip itself, i.e., not a laser inside a can as typically provided for a macroscopic system. Since the dimensions of the integrated system are much smaller than those for a conventional macroscopic system, the light source must be fairly close to the DOE 6, so that the beam will not be too large thereon and all of the beam will be received by the DOE 6. Thus, part of the integrated approach of the present invention preferably includes providing the laser chip or die itself adjacent to a transparent substrate.

In forming an integrated optical apparatus, the first design was to attempt to simply scale down a macroscopic design. In other words, a single lens was placed in the return path, as shown in FIG. 1A. In a macroscopic configuration, this lens in the return path provides both separation to the beams as well as focussing thereof in order to properly deliver them to the detector.

In the transmit path from the light source to the detector, the light from the light source 10 is delivered to the DOE on the top surface of the substrate 11 at a distance from the light source 10. This distance is used to advantage to provide an adequately wide beam at the DOE. The beams formed by the DOE are focused on surface 14 located at a distance from the lens 12. This distance is chosen to achieve adequate spot size modulation depth and depth of focus at the media surface.

In the return path from the target 14 to the detector 17, the refractive lens 8 is located at a distance d2 from the target and the detector 17 is located a distance d1 from the refractive lens 8. The distances d1, d2 are dictated by the substrates 11, 21 on which these elements are mounted. The ratio of the distances d1/d2 determines the amount of demagnification of the image reflected from the media that occurs in a lens. In using a single lens in the return path, this demagnification affects not only spot size but spot spacing. Assuming, for example, a spot size of 0.020 mm on the target 14, a demagnification of ¼ gives a spot size of 0.005 mm which because of aberration is spread to an area 0.025 mm. When a single lens in the return path is used, as shown in FIG. 1A, the spacing of the spots is demagnified to 0.025 mm and significant crosstalk noise results. This can be seen by the overlapping beams in the plane of the detector 17 in FIG. 1A. The overlapping of the beams also occurs at the return refractive lens 8. In order for the refractive lens to image the beams at a point at which they are sufficiently separated such that the beams will be distinguishable on the detector 17, the return refractive lens 8 would have to be placed closer to the target 14. However, such positioning would destroy the desired integrated nature of the optical apparatus.

In this configuration, in order for the return refractive lens 8 to properly focus the beams, the angles of the beams 2, 4 need to be as small as possible and as similar as possible, so that these beams may both impinge upon a central portion of the return refractive lens 8. In the relative scale of FIG. 1A, using the distances from the top surface of the top substrates to the target, the angle of beam 2 is 5.6 degrees and the angle of beam 4 is 6.9 degrees. However, the beams 2, 4 also need to be sufficiently separated on the detector 17. These two design constraints cannot be met using the single refractive lens 8 for receiving all of the beams in the return path while providing an integrated optical apparatus.

Figure 1B:
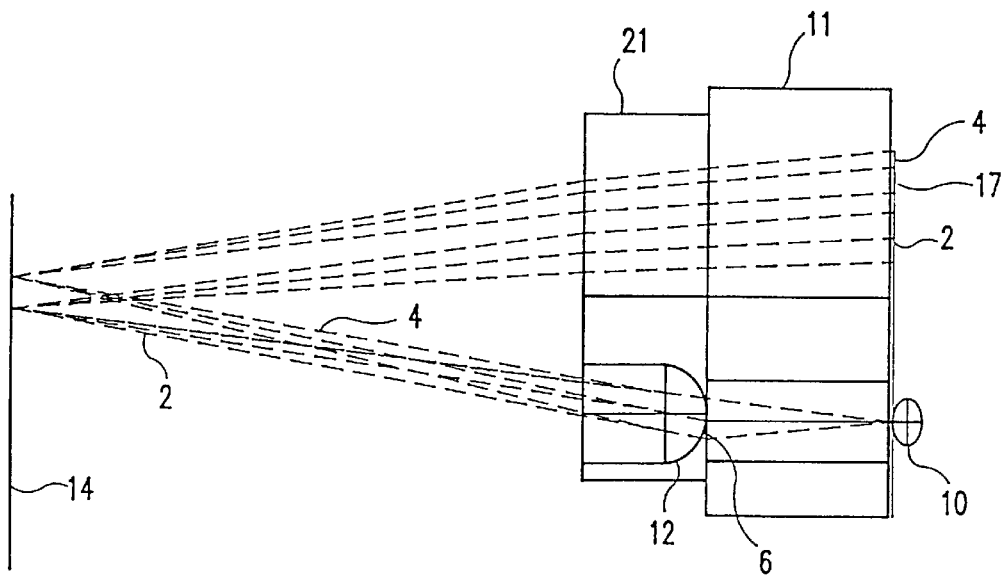
FIG. 1B is a schematic view of another configuration of an integrated optical apparatus in accordance with the present invention.

FIG. 1B is an alternative configuration created by recognizing that by providing larger angles to the light beams and providing greater difference between the angles of the light beams, the need for an optical element in the return path could be eliminated. In other words, the separation between the light beams 2,4 in FIG. 1B is sufficient such that the beams remain separate and distinguishable on the detector 17 without requiring an optical element in the return path to provide this separation. In FIG. 1B, the angle of beam 2 is 8 degrees and the angle of beam 4 is 11 degrees.

In FIG. 1B, the distance between the top surfaces of the top substrates and the target 14 is the same as it was in FIG. 1A. This clearly results in the beams being further separated on the target 14. For many applications, this increased separation is not a problem, but for those for which a particular separation is desired, the integrated optical head can be positioned closer to the target 14.

Figure 1C:
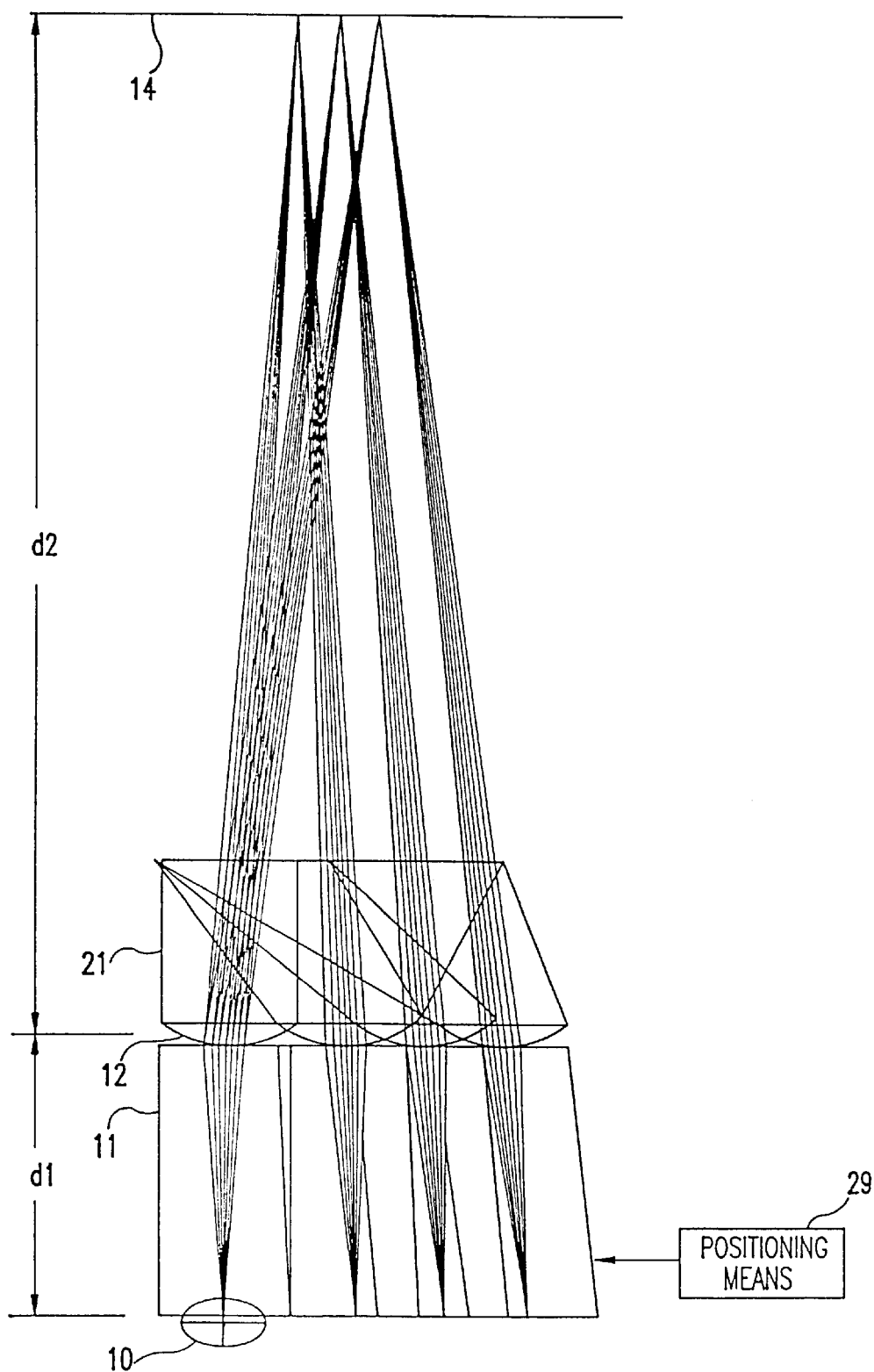
FIG. 1C is a schematic view of an integrated optical apparatus according to the present invention.

While the configuration shown in FIG. 1B is advantageous for integrated apparatuses, for many applications, the complete elimination of optical elements in the return path results in an unacceptable level of noise. A solution, an example of which is shown in FIG. 1C is to include separate optical elements for each beam in the return path. The ability to use more than one optical element in the return path can be realized due to the increased separation between the beams. The feasibility of such a solution, requiring more than one optical element for each beam, is facilitated by the passive alignment discussed in detail below.

FIG. 1C is an optical design schematic of an assembly according to the invention for use in, for example, detecting an optical track on a storage media. A light source 10 directs coherent light, with a dispersion angle of fifteen degrees, upward through an object distance d1 through a diffractive element (DOE) not shown and to a refractive lens 12. The DOE divides the light into a number of beams, only three of which are shown as a plurality of rays in FIG. 1C. The beams are focused on surface 14 located at an image distance from the lens 12. The spot size and spacing of the light on the image surface 14 determines the tracking accuracy and therefore the amount of information that can be stored on the media. The size to which the spot can be reduced is in the instant design, approximately 0.020 mm. In the design of FIG. 1, the refractive lens 12 must have a significant curvature in order to focus the light to 0.020 mm spots on the media. The spots of light are spaced approximately 0.100 mm from each other on the media to limit crosstalk noise. As would be readily understood by those skilled in the art the optical head can be positioned by the illustrated positioning means 29.

Preferably, all optical elements needed to create the more than one beam, direct the beams onto the target and direct the beams from the target to the detector are on the substrate and/or any structure bonded thereto, thereby providing an integrated optical apparatus. Preferably, any optical elements in both the return path and the transmit path are less than 500 microns in diameter, more preferably, less than 300 microns in diameter. The actual size of the elements will be dictated by the overall size of the device with which the integrated optical apparatus is to be used, with a lower practical limit being on the order of a wavelength.

If a design were attempted using a single lens as taught in the prior art where the elements are not integrated, the lens curvature required to focus the laser light to 0.020 mm spots in this compact architecture would control the dimensions of the single lens. Thus the use of a single lens as taught in the prior art for reducing the size of optical heads, is a limiting factor in size reduction of the entire optical head assembly. This factor is one of the reasons that multiple lenses are employed in the instant invention instead of a single lens. The use of multiple lenses is enabled by having the separation between the beams be sufficient so that each beam is incident only on one of the lenses in the return path.

The ratio of the distances d1/d2 determines the amount of demagnification of the image reflected from the media that occurs in a lens. In a single lens design, this demagnification affects not only spot size but spot spacing. A demagnification of ¼ gives a spot size of 0.005 mm which because of aberration is spread to an area 0.025 mm. If a single lens design had been used, the spacing of the spots would also have been demagnified to 0.025 mm and significant crosstalk noise would result. By using individual lenses, spaced approximately 0.200 mm, the detectors can be spaced at about 0.220 mm and thereby eliminate crosstalk noise using the 0.025 mm light spots.

Thus, by providing increased separation to the beams in the transmit path, separate optical elements for each beam's return path may be used, thus allowing proper focussing of the beams on the detector. Further, such separate elements are more readily integrated into a compact system. In an integrated system, it is advantageous to place the grating on the media as close to the light source as possible, but separation between the beams needs to be maintained. If the distance is too small, in order to maintain the separation, a bigger angular deflection is required. Then the beams are more spread out and the system will become too large in the x-y direction (with z being in the plane of the paper). This spread also increases the aberrations. Therefore, the angles need to be as small as possible, while maintaining separation even over the small distance from the light source and to the detector.

Figure 2:
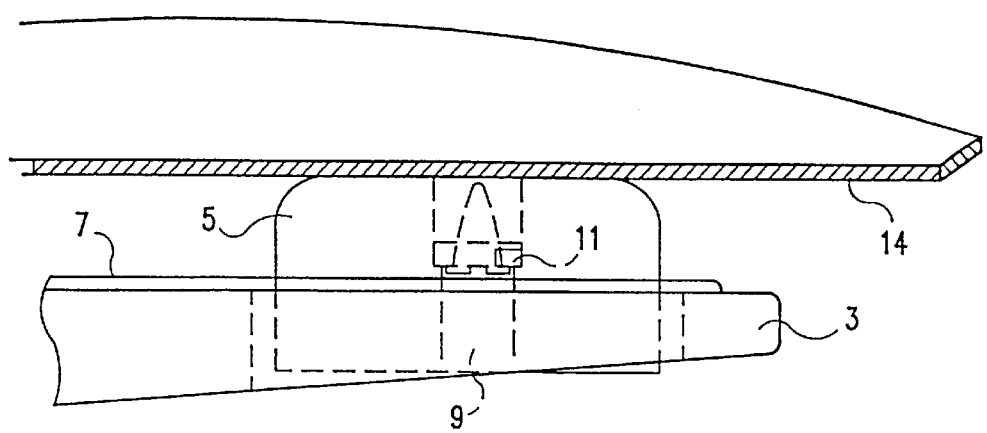
FIG. 2 is a fragmentary side perspective view of an integrated optical apparatus according to the present invention.

FIG. 2 is a side view of a magnetic floppy disk head 5 with an optical tracking assembly according to a preferred embodiment of the invention. Head 5 is mounted, in arm 3 by known means not shown, for the extension across the various tracks of media 14. Head 5 is electrically connected to read and write circuits and tracing control circuits by a flexible printed circuit 7. A recess 9 of approximately two millimeters by one point six millimeters and four and a half or five millimeters deep is provided in head 5 in which the optical assembly comprising substrate 11 is mounted and connected to flexible printed circuit 7. It will be appreciated that the same assembly techniques and methods of the invention may be used to assemble optical disk read heads, as well as magnetic disk heads with optical tracking.

Referring now to FIG. 3, a first transparent substrate 11 comprising fused silica or other optical material has component mounting metalized pads or contact pads placed on its bottom surface 13, such as using substrate fiducial marks or indicia and accurately aligned photolithographic masks and metal deposition steps known in the art of microelectronic circuit manufacture. In this preferred embodiment, surface 13 of substrate 11 is approximately 1.6 mm by 2 mm and the substrate 11 is approximately 0.8 mm thick. A laser chip 15 is mounted to the surface 13 by means of some of the mentioned metalized pads. As shown in FIG. 4, laser 15 is an edge emitting laser with the laser light directed upwards through means of a precision mirror 33 as shown in FIG. 4. It will by understood that the edge emitting laser 15 can be replaced with a vertical cavity surface emitting laser and thereby obviate the need for the precision mirror in order to direct the laser beam normal to the substrate surface.

An optical detector chip 17 is also mounted to the component surface of substrate 11 by means of the metalized pads. A hologram surface 19 on the opposite side of substrate 11 carries the diffractive optical elements shown in detail in FIG. 7. The diffractive optical element phase profiles are designed using the computer calculations and manufactured using techniques taught by Swanson et al. in U.S. Pat. No. 5,161,059, the entire disclosure of which is incorporated herein by reference.

The optical elements are created photolithographically using the same fiducial marks or indicia used to place the metalized pads. Alternately second fiducial marks that have been aligned with the first marks may be used to align the masks that are also used to create the optical elements. In this way, when the light source, mirror and detector are mounted on their metalized pads, the optical paths among the devices and through the optical elements are in optical alignment as shown more clearly in FIGS. 3A and 3B. The precision mirror, if needed for redirecting light from an edge emitting laser, is considered to be a device for the purposes of this description only because of the way it is mounted using metalized pads and solder as a silicon chip would be mounted. The hologram surface 19 also has the attachment areas 23 that attach the first transparent substrate 11 with a second transparent substrate 21.

The second substrate 21 carries the refractive optics in a surface 25 that provides the second lens of lens pairs or doublets. Light from laser 15 is shaped and split by a diffractive optical element in hologram surface 19 into five separate beams of light that are directed through substrate and travel approximately 2.4 mm to the media. Only the chief ray of each beam is shown in FIG. 3 for clarity of the description. One beam is used for intensity feedback to control the electrical power to laser 15. The other four beams are used for media position or tracking detection. The beams of coherent light are reflected from media 14 and return through second substrate 21 and first substrate 11 to be detected by detector 17. Since the elements are all in their designed optical alignment by virtue of the placement of the metalization pads, there is no need to energize the laser and move the elements relative to each other to bring them into optical alignment. In other words, passive alignment is used rather than the active alignment requiring operation of the laser as in the prior art. It will be recognized that although the beams preferably pass first through the diffractive optical element in surface 19, the order of the optical elements in the light path could be changed or the elements could be combined into one more complex element without departing from the scope of the invention.

Figures 3A, 3B:
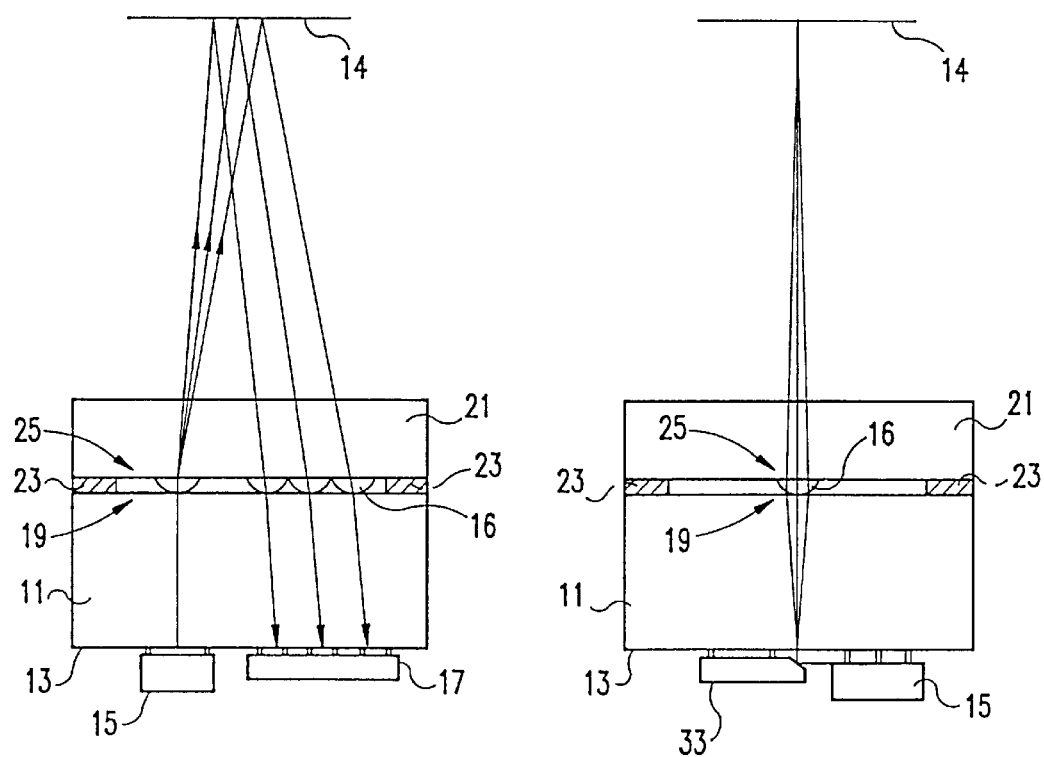
FIG. 3A is a side elevational view of an integrated optical apparatus according to the present invention.
FIG. 3B is side elevational view of the integrated optical apparatus as shown in FIG. 3A rotated ninety degrees.

FIG. 3B is another side view of the assembly of FIG. 3A. As shown in FIG. 3B, the light emitted by edge emitting laser 15 comes out substantially parallel to the plane of component surface 13 and must be directed normal to the component surface by the 45 degree surface of mirror 33. The light can then pass through substrate 11, a diffractive optical element in surface 19, a refractive lens 61 in surface 25, substrate 21 and be reflected from media 14 as shown in FIGS. 1A–1C and 3A.

Figure 4A:
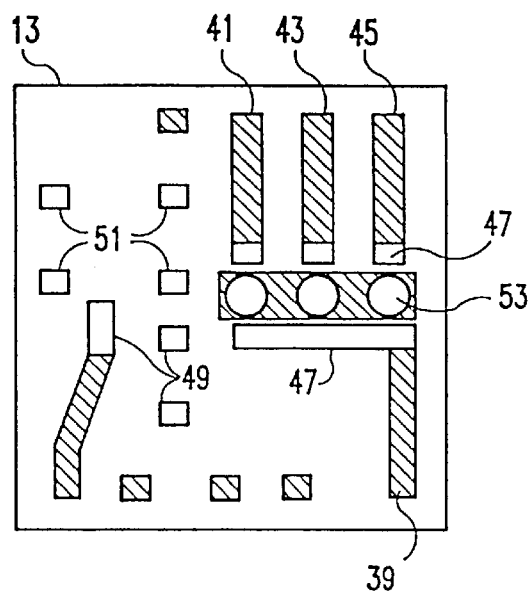
FIG. 4A is a plan view of the component side of a first transparent substrate of an integrated optical apparatus according to the present invention.

FIG. 4A is a plan top view of the component surface 13 looking down through transparent substrate 11. Electrical contact metalizations 39, 41, 43 and 45 provide electrical connections to detecting photo-diodes in detector 17. Centered under detector 17 is a metalized area 53 having three apertures through which light reflected from media 14 is received. Solder ball alignment areas 47 on each side of area 53 serve both as electrical contacts and as alignment mechanisms in this embodiment. The areas 49 are also solder balls or pads which serve to align and connect the laser 15 to the first substrate and provide current to laser 15. Areas 51 on the other hand only provide mechanical alignment and mechanical attachment of mirror 33 to first transparent substrate 11.

The hologram surface 19 appears in FIG. 4B in plan view, again looking down onto substrate 11. Hologram surface 19 has metalized area 55 which acts as a mask to reduce stray light but allow three beams created by diffractive optics from the light from laser to be directed to media 14 from which they are reflected to reach detector 17 through the five apertures shown in metalized areas 59. Surrounding metalized area 55 is a diffraction grating 57 that scatters stray light from laser 15 so that it does not adversely affect detector 17.

Figure 4B:
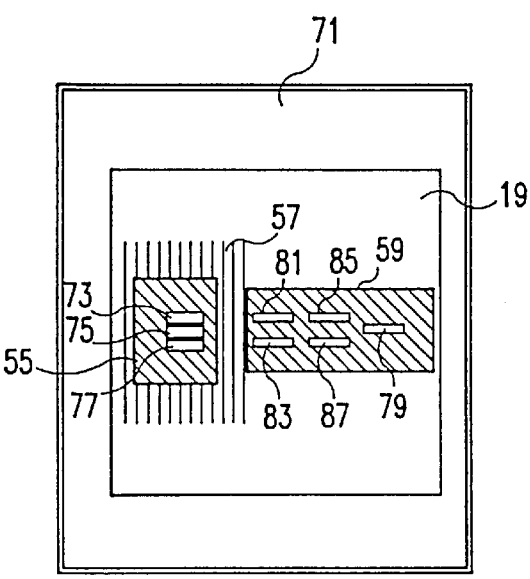
FIG. 4B is a plan view of a holographic optical element of a first transparent substrate of an integrated optical apparatus according to the present invention.
Figure 4C:
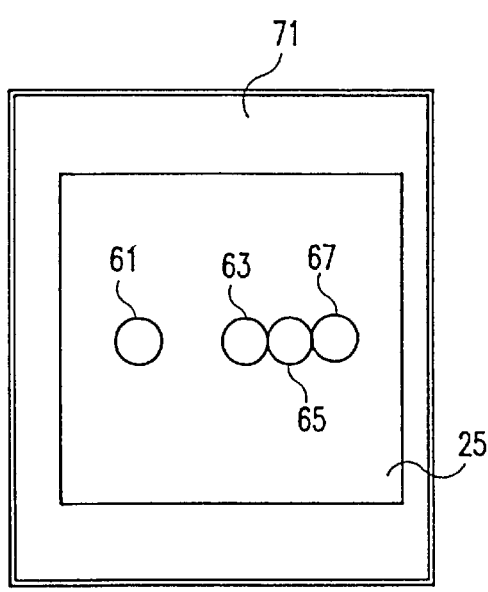
FIG. 4C is a plan view of a refractive lens surface of a second transparent substrate of an integrated optical apparatus according to the present invention.

FIG. 4C shows the refractive lens surface 25, again in plan view looking down, this time through substrate 21. Lens 61 in combination with the diffractive optical elements in mask 55 shape and focus the laser light into three spots of approximately 20 Am diameter and spaced at approximately 100 microns onto media 14. Lenses 63 and 65 focus the light reflected from media 14 through mask 59 to detector 17 for position control and/or reading. Lens 67 focuses reflected light to the photo-diode of detector 17 that provides an intensity level signal to the power control circuits which control the electrical power provided to laser 15. Surrounding both surface 19 and surface 25 is an attachment area shown generally as area 71 in FIGS. 4B and 4C. Area 71 contains spacing stand off benches and is the area in which an adhesive is placed in order to join substrate 21. The standoff benches passively define a proper or desired vertical spacing or alignment. Preferably the adhesive is ultraviolet light cured adhesive that can be laid down without concern for time to harden. The adhesive is placed in areas 71 and then after the substrates 11 and 21 are aligned, the assembly is flooded with ultra-violet light to catalyze the adhesive. In an alternate embodiment, the adhesive is replaced with photolithographically placed metalization pads and the two substrates are joined using solder ball technology.

Figure 8:
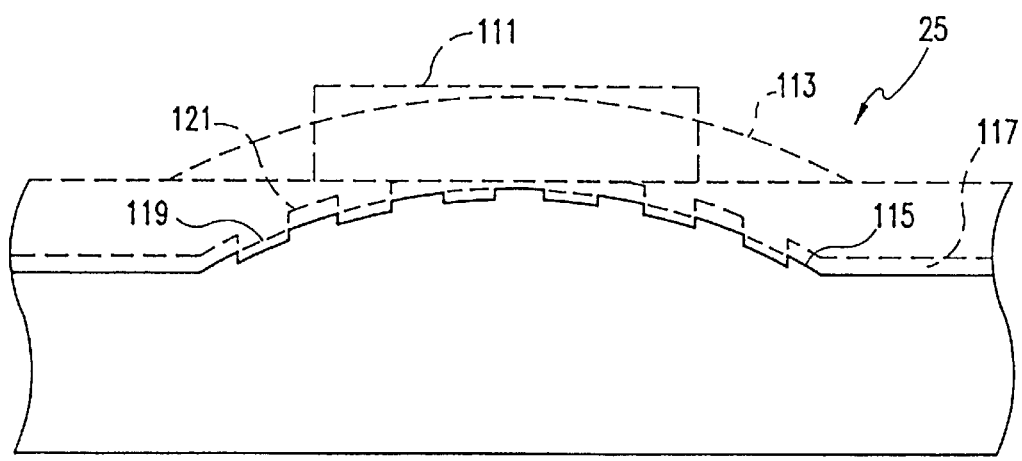
FIG. 8 is a vertical sectional view of a substrate showing a method of creating a hybrid microlens for an integrated optical head according to the invention.

FIG. 4B also shows three diffractive optical elements 73, 75 with mask 55. These three elements 35 provide the five beams of light to be reflected from the media, the three main rays of which are shown in FIG. 3A. Element 75 provides the power control beam that is reflected from the media and is received at aperture 79 in mask 59 as shown in FIG. 8. Elements 73 and 77 each provide two beams that interfere at the media surface to create a dark band with two light bands on either side of the dark bands. The light bands are reflected back down to the pairs of apertures 81, 83 and 85, 87 shown in FIG. 4C to provide the varying light intensity that is used to detect an optical track on the media. The apertures 73, 75 and 77 containing diffractive elements are each approximately 100 microns long and 20 microns wide.

Figure 5:
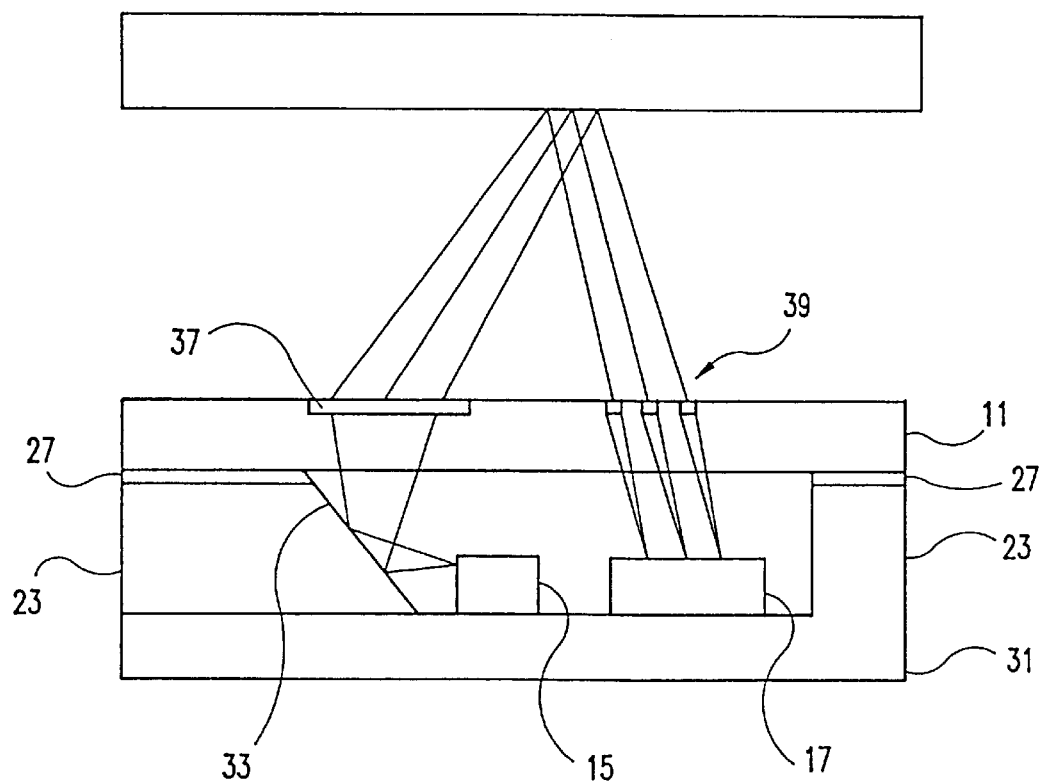
FIG. 5 is a cross sectional view of an integrated optical apparatus of the present invention having a diffractive element in the transmit path and separate diffractive elements in the return path.

FIG. 5 illustrates an alternative to providing separate refractive elements in each return path. In FIG. 5, each refractive element in the return path has been replaced with a diffractive element 39. The refractive element in the transmit path has also been replaced with a diffractive element 37 for splitting radiation output by the radiation source 15, and delivered to the diffractive element 37 via the precision mirror 33. The diffractive element 37 provides separation to the beams delivered to the grating on the surface 14. The use of diffractive elements in the return path is typically not as advantageous as refractive elements. The diffractive elements are more wavelength dependent and less efficient for larger angles.

Figure 6:
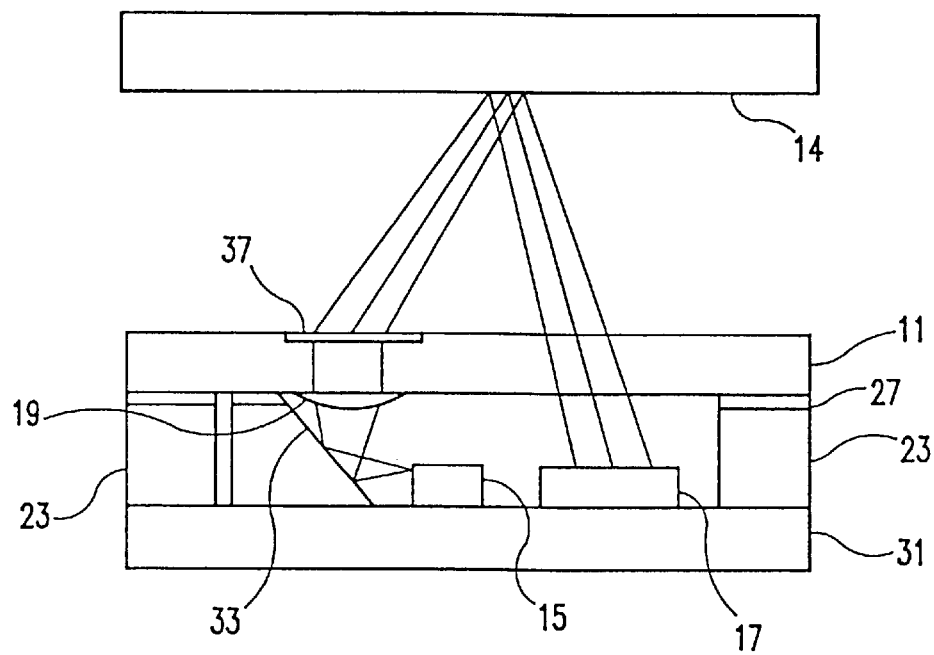
FIG. 6 is a cross sectional view of an integrated optical head of the present invention having a diffractive element and a refractive element on a single substrate in the transmit path and no optical elements in the return path.
Figure 7:
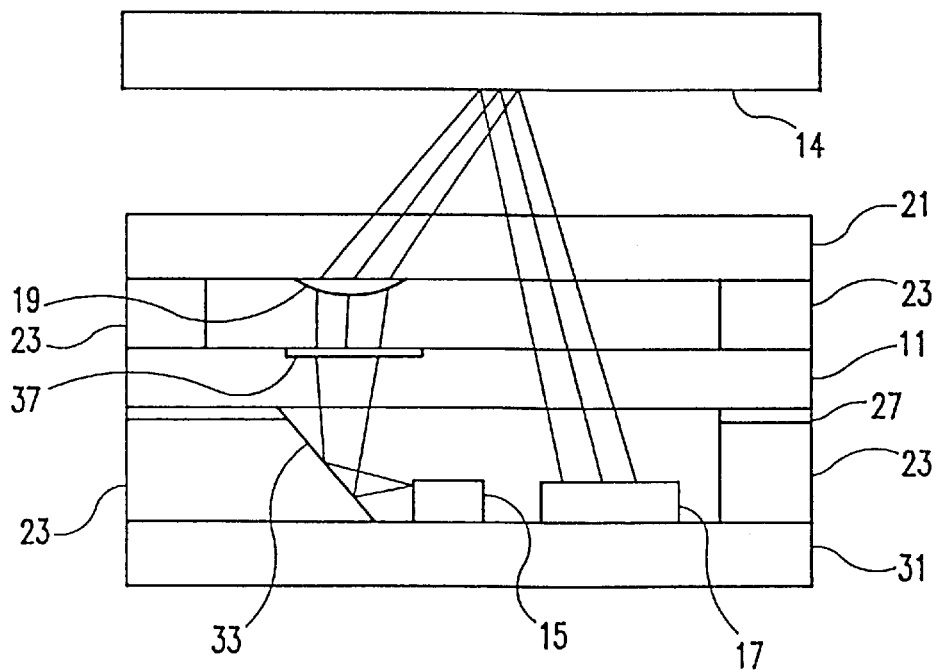
FIG. 7 is a. a cross sectional view of an integrated optical head of the present invention having a diffractive element and a refractive element on two substrates in the transmit path and no optical elements in the return path.

Also in FIG. 5, as well as FIGS. 6–7, the active elements are mounted on a support substrate 31, preferably a silicon substrate. This support substrate 31 also serves as a heat sink for the active elements mounted thereon. Attachment areas 23 separate the substrate 31 from the substrate 11 on which the diffractive elements 37, 39 are mounted. The active elements may be mounted support substrate 31 using passive alignment in a similar manner as discussed above regarding the mounting of these elements on the transparent substrate 11. The attachment areas 23 can be provided by etching a recess into the support substrate 31 in which the laser 15, the detector 17, and the optional mirror 33 may be provided. In other words, the unetched portions of the substrate 31 serve as attachment areas 23. The substrates 11, 31 may then be bonded with solder material 27. Further, an angled sidewall of the substrate adjacent the recess therein can serve as the mirror 33. Alternately, the attachment areas 23 may include spacer block separate from the substrate 31, as shown in FIGS. 6 and 7. The mirror 33 can be a separate element from the spacer blocks, as shown in FIG. 6 or can itself serve as a spacer block, as shown in FIG. 7.

As shown in FIG. 6, another embodiment of the present invention is directed to employing no optical elements in the return path. The diffractive element 37 in the transmit path is designed to provide sufficient spread to the radiation such that the beams incident on the detector 17 are still distinguishable. This is facilitated by the provision of a refractive element 19 on an opposite surface of the substrate 11 from the diffractive element.

FIG. 7 illustrates yet another embodiment in which no optical elements are used in the transmit path. In FIG. 7, the refractive element 19 is mounted opposite the diffractive element 37 on a further substrate 21.

Referring now to FIG. 8, a method of photolithographically placing an optical element on a substrate surface 25 in alignment with diffractive elements and/or electrical devices is shown. A refractive optical element in the form of a microlens 115 is formed by placing a circular layer of photoresist 111 on a surface of optical material using a mask. The photoresist is then partially flowed using controlled heat so that the photoresist assumes a partially spherical shape 113. Thereafter, the surface 25 is etched and a refractive element 115 having substantially the same shape as the photoresist 113 is formed by the variable etch rate of the continuously varying thickness of the photoresist 113. In the event that a hybrid optical element is desired, the microlens 115 is further processed by etching or embossing steps. In one embodiment, a layer of photoresist 117 is placed over the microlens 115 and exposed through a photolithographic mask with the phase pattern of a diffractive optical element. When the exposed photoresist is then developed, the surface of the microlens can be further etched with the diffractive optical element pattern to produce a hybrid optical element 119. In another embodiment, a polymer is placed over the microlens in place of the photoresist and the phase pattern is embossed into the polymer as shown at 121. It also will be understood that although a convex element has been shown, the same technique can be used to create a concave microlens. The single surface hybrid element 119 is preferably used in the transmit path, for example, in place of the two surface hybrid element shown in FIG. 6.

In the structures of all of the figures discussed throughout having more than one substrate, all of the substrates may be passively aligned and attached using patterns formed photolithographically as discussed below. While the following discussion references the transparent substrates 11, 21, the support substrate 31 may also be aligned in an analogous fashion. When aligning the support substrate containing active elements, the integrated optical apparatuses shown in FIGS. 5–7 may be formed by passively aligning a support wafer having a plurality of active elements thereon with a transparent wafer having a corresponding plurality of optical elements. This support-transparent wafer pair may then be diced apart. Alternatively, the support wafer can be diced and individual laser/detector assemblies aligned and attached to the transparent wafer such as by flip-chip attachment. By first forming individual active assemblies, the lasers can be tested separately.

Figure 9:
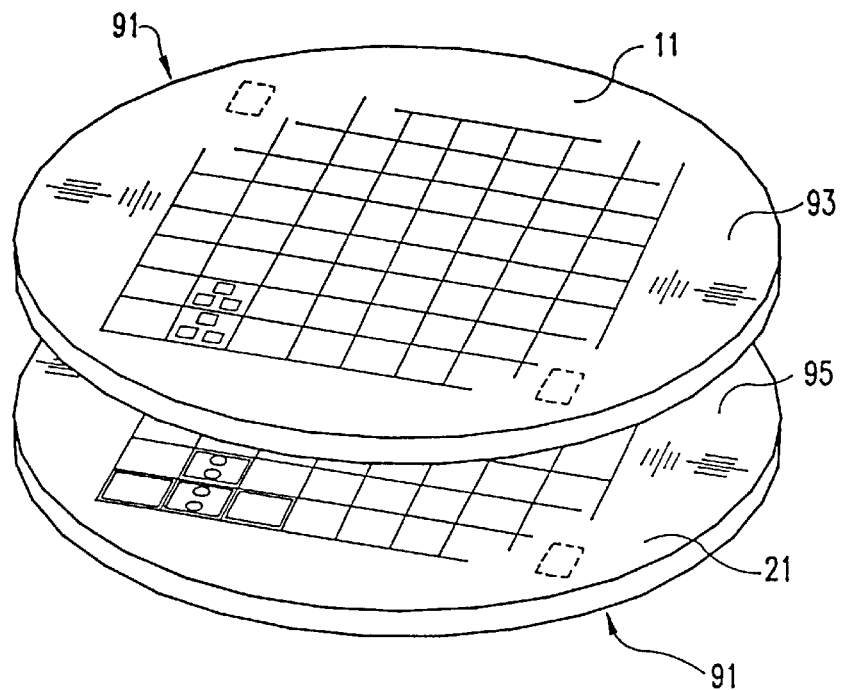
FIG. 9 is a perspective view showing an article including two wafers according to the present invention.

FIG. 9 shows the two transparent substrates 11 and 21 prior to their being assembled into optical assemblies and diced. Because each element has been accurately placed on each substrate using photolithography, the entire wafers can be aligned and joined prior to being diced into chips without the need to energize any of the laser devices on the substrate 11. FIG. 9 shows the substrates inverted from the way they are shown in FIGS. 2, 3A and 3B in order to show the lasers, mirrors and detectors in place on top of each die. Of course, if the support substrate 31 being aligned with one or both of the transparent substrates, to form the configurations shown in FIGS. 5–7, these active elements are not on the top of the wafer 11.

Prior to putting the wafers together, the adhesive material, e.g., ultra-violet curable solder, is placed in the area 71 of each die on at least one of the wafers. After the adhesive is placed, the two wafers are placed one above the other and aligned. In one embodiment of the invention, a known photolithographic mask aligning tool is used with vernier fiduciary marks 93 and 95 to monitor the relative displacement of the two substrates until they are in alignment with each other. The substrate 11 can then be lowered onto substrate 21, the alignment—rechecked, and the adhesive catalyzed by ultraviolet light.

Figure 10A:
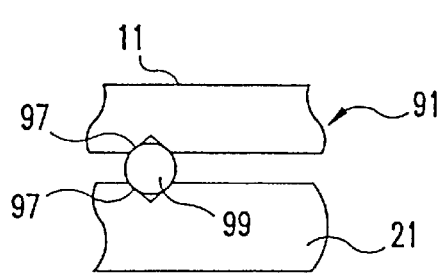
FIGS. 10A–10D are vertical fragmentary sectional views of example alignment features according to the present invention.

In another embodiment, the two wafers are passively aligned using mechanical mating elements 91. Three forms of mechanical mating elements, in addition to the spacer block previously discussed, are contemplated and shown in FIGS. 10A, 10B and 10C. One, shown in FIG. 10A, takes the form of V-shaped grooves 97 etched into matching faces of the substrates 11 and 21. These grooves are then aligned with sphere 99 to index the two wafers into alignment. Note that only a few grooves and spheres are needed to align all of the dies while they are still together as a wafer. Another embodiment of the alignment means, shown in FIG. 10B, comprises photolithographically placed metalization pads 101 which are then connected by reflowing a solder ball 103. Alternatively, the metalization pads 101 may be solder, without the need for the solder ball 103. In a still further embodiment of FIG. 10C, a bench 105 is raised by etching the surrounding surface and the bench 105 is indexed into a recess 107, also created by photolithographically placed etchant, preferably reactive ion etchant.

Figure 10B:
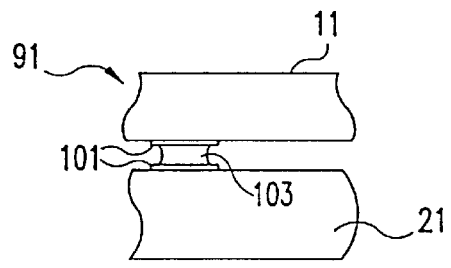
Figure 10C:
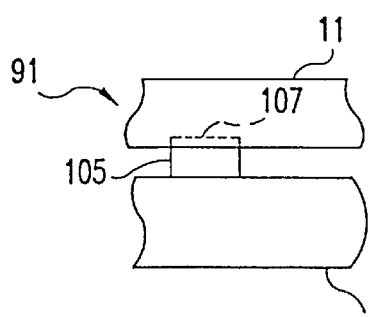
Figure 10D:
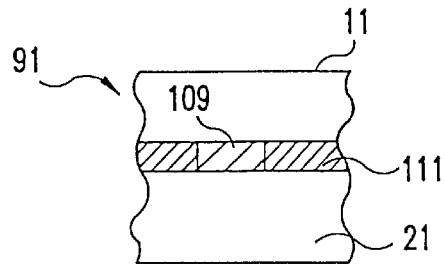

In the adhesive area 71 of each die, means may be needed to accurately space the two substrates from each other. Spacing is accomplished in one embodiment by means of a bench 109 shown in FIG. 10D. Three or more benches 109 are located in the area 71 around each die in an adhesive with high compressive. In another embodiment, the solder bumps or balls and metalizations are used in area 23 accomplishing both attachment and alignment as shown in FIG. 10B. Alternately, when an adhesive with high compressive strength is chosen, only three or more such benches are needed for spacing the entire wafers and after the adhesive has set, the joined wafers can be diced without substrate spacing.

Having described the invention in terms of preferred embodiments thereof, it will be recognized by those skilled in the art of optical system design that various further changes in the structure and detail of the implementations described can be made without departing from is the spirit and scope of the invention. By way of example, the diffractive optical elements may be placed on the same surface of a substrate on which the electronic components are accurately placed with these diffractive optical elements using photolithography. Likewise refractive optical elements may be placed using photolithography in alignment on the other surface of the same substrate thereby allowing an entire optical assembly to be fabricated using but one substrate without the need for actively energizing a light source in the assembly to accomplish alignment.

In the drawings and specification, there have been disclosed illustrated preferred embodiments of the invention, and although specific terms are employed, the terms are used in a descriptive sense only and not for purposes of limitation. The invention has been described in considerable detail with specific reference to these illustrated embodiments. It will be apparent, however, that various modifications and changes can be made within the spirit and scope of the invention as described in the foregoing specification and as defined in the appended claims.

What is claimed is:

1. An integrated optical apparatus comprising:
   a first substrate being optically transparent and having first and second opposing faces;
   a divider on said first substrate receiving an input beam, outputting at least two beams and directed said at least two beams to a surface separate from the integrated optical apparatus; and
   a detector receiving at least one of said at least two beams from the surface, wherein all optical elements needed to create said at least two beams, direct said at least two beams onto the surface, and direct said at least one of said at least two beams from the surface onto said detector are on at least one of said first substrate and any structure bonded to said first substrate; and
   mechanical mating means for passively aligning said detector to said first substrate.

2. The apparatus according to claim 1, wherein said detector includes at least two light detecting elements for receiving a respective beam of said at least two beams reflected from the surface, wherein said divider provides sufficient separation between said at least two beams such that each beam of said at least two beams delivered to said detector is delivered to a unique respective light detecting element of said at least two light detecting elements.

3. The apparatus according to claim 2, wherein said light detecting elements comprises more than one area on a single detector.

4. The apparatus according to claim 1, wherein said all optical elements include elements providing focusing to said at least one of said at least two beams onto said detector.

5. The apparatus according to claim 1, further comprising:
   a support substrate, wherein said detector is mounted on said support substrate; and
   means for bonding said support substrate and said first substrate together.

6. The apparatus according to claim 5, wherein said means for bonding includes spacer blocks between said first substrate and said support substrate.

7. The apparatus of claim 1, wherein said mechanical mating means includes spacer blocks for providing a precise separation between the detector and the first substrate.

8. The apparatus according to claim 1, wherein said first substrate further comprises at least on metal pad on a bottom face of the substrate used to assist in positioning said detector.

9. The apparatus according to claim 8, further comprising a solder pad on top of said at least one metal pad.

10. The apparatus according to claim 1, wherein said any structure bonded to said first substrate comprises:
    a second substrate being optically transparent and having optical elements integrated thereon; and
    means for bonding said second substrate and said first substrate together.

11. The apparatus according to claim 10, wherein said means for bonding includes spacer blocks between said first substrate and said second substrate.

12. The apparatus according to claim 1, wherein said divider is a single diffractive optical element.

13. The apparatus according to claim 1, wherein said divider includes a plurality of diffractive optical elements.

14. The apparatus according to claim 1, wherein optical elements directing said at least one of said at least two beams from the surface onto the detector are separate from optical elements needed to create said at least two beams.

15. The apparatus according to claim 1, wherein optical elements needed to create said at least two beams and direct said at least two beams onto the surface are a single optical element.

16. The apparatus according to claim 1, wherein said all optical elements are in an optical path before said at least two beams impinge on the surface.

17. A method for integrating an optical apparatus comprising:
    providing a divider on a first substrate, said first substrate being optically transparent, the divider receiving an light, dividing the light into at least two beams and directing said at least two beams to a surface;
    mounting a detector adjacent to the first substrate, the detector receiving at least one of said at least two beams from the surface separate from the integrated optical apparatus; and
    providing all optical elements needed to create the at least two beams, direct the at least two beams onto the surface, and direct the at least one of the at least two beams from the surface onto the detector are on at least one of the first substrate and any structure bonded to the first substrate, said providing including passively aligning the detector with the first substrate.

18. The method according to claim 17, further comprising:
    mounting the detector on a support substrate; and
    bonding the support substrate and the first substrate together.

19. The method according to claim 17, further comprising bonding a second substrate and the first substrate together, the second substrate being optically transparent and having optical elements thereon.

20. The method according to claim 17, further comprising precisely separating the detector and the first substrate via spacer blocks.

21. The method according to claim 17, further comprising providing at least one metal pad on a bottom face of the first substrate for assisting in positioning of the detector.

22. The method according to claim 21, further comprising providing a solder pad on the at least one metal pad.

23. The method of claim 17, wherein the first substrate is a wafer, said detector is mounted on a wafer level and then a resultant structure is diced to form a plurality of integrated optical apparatuses.

24. An integrated optical apparatus comprising:
    a first substrate being optically transparent and having first and second opposing faces;
    a divider on said first substrate receiving an input beam, outputting at least two beams and directed said at least two beams to a surface separate from the integrated optical apparatus; and
    a detector receiving at lest one of said at least two beams from the surface, wherein all optical elements needed to create said at least two beams, direct said at least two beams onto the surface, and direct said at least one of said at least two beams from the surface onto said detector are on at least one of said first substrate and any structure bonded to said first substrate, wherein said first substrate further include at least one metal pad on a bottom surface used to assist in positioning said detector.

25. An integrated optical apparatus comprising:
    a first substrate being optically transparent and having first and second opposing faces;
    a divider on said first substrate receiving an input beam, outputting at least two beams and directed said at least two beams to a surface separate from the integrated optical apparatus, wherein optical elements needed to create said at least two beams and direct said at least two beams onto the surface are a single optical element; and a detector receiving at least one of said at least two beams from the surface, wherein all optical elements needed to create said at least two beams, direct said at least two beams onto the surface, and direct said at least one of said at least two beams from the surface onto said detector are on at least one of said first substrate and any structure bonded to said first substrate.

26. An integrated optical apparatus comprising:

a first substrate being optically transparent and having first and second opposing faces;

a divider on said first substrate receiving an input beam, outputting at least two beams and directed said at least two beams to a surface separate from the integrated optical apparatus, wherein optical elements needed to create said at least two beams and direct said at least two beams onto the surface are a single optical element; and a detector receiving at least one of said at least two beams from the surface, wherein all optical elements needed to create said at least two beams, direct said at least two beams onto the surface, and direct said at least one of said at least two beams from the surface onto said detector are on at least one of said first substrate and any structure bonded to said first substrate, wherein said all optical elements are in an optical path before said at least two beams impinge on the surface.

* * * * *